United States Patent
Lin et al.

(10) Patent No.: US 8,618,608 B2
(45) Date of Patent: Dec. 31, 2013

(54) LATERAL SILICON CONTROLLED RECTIFIER STRUCTURE

(75) Inventors: Ta-Cheng Lin, Hsin-Chu (TW); Te-Chang Wu, Hsinshu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 906 days.

(21) Appl. No.: 12/346,842

(22) Filed: Dec. 31, 2008

(65) Prior Publication Data
US 2010/0163924 A1 Jul. 1, 2010

(51) Int. Cl.
*H01L 23/62* (2006.01)
(52) U.S. Cl.
USPC ............ 257/363; 257/206; 257/213; 257/288; 257/355; 257/358; 257/389; 257/401; 257/E23.07; 257/E23.151; 257/E29.026; 257/E29.018; 257/E29.005; 361/56; 361/91.5; 361/111
(58) Field of Classification Search
USPC ............ 257/36–363, 389, 401, E23.07, 257/E23.151, E29.026, E29.12, E29.018, 257/E29.005; 361/56, 91.5, 111
See application file for complete search history.

(56) References Cited

U.S. PATENT DOCUMENTS

| | | | |
|---|---|---|---|
| 4,939,616 A | 7/1990 | Rountree | |
| 5,012,317 A | 4/1991 | Rountre | |
| 5,225,702 A | 7/1993 | Chatterjee | |
| 5,465,189 A | 11/1995 | Polgreen et al. | |
| 6,081,002 A | 6/2000 | Amerasekera et al. | |
| 6,594,132 B1 * | 7/2003 | Avery | 361/111 |
| 6,921,931 B2 * | 7/2005 | Higashi et al. | 257/173 |
| 2002/0109190 A1 * | 8/2002 | Ker et al. | 257/355 |
| 2008/0087962 A1 * | 4/2008 | Salman et al. | 257/356 |

* cited by examiner

*Primary Examiner* — Meiya Li
(74) *Attorney, Agent, or Firm* — Winston Hsu; Scott Margo

(57) ABSTRACT

A lateral silicon controlled rectifier structure includes a P-type substrate; an N-well region in the P-type substrate; a first $P^+$ doped region in the N-well region and being connected to an anode; a P-well region in the P-type substrate and bordering upon the N-well region; a first $N^+$ doped region formed in the P-well region and separated from the first $P^+$ doped region by a spacing distance, the first $N^+$ doped region being connected to a cathode; and a gate structure overlying a portion of the P-type substrate between the first $P^+$ doped region and the first $N^+$ doped region.

14 Claims, 2 Drawing Sheets

LATERAL SILICON CONTROLLED RECTIFIER STRUCTURE

BACKGROUND OF THE INVENTION

1. Field of the Invention

This invention relates in general to electronic circuits, and more particularly, to lateral silicon controlled rectifier (LSCR) structures for electro-static discharge (ESD) protection.

2. Description of the Prior Art

Electro-static discharge (ESD) is a significant problem in integrated circuit design, especially for devices with high pin counts and circuit speeds. ESD refers to the phenomena wherein a high-energy electrical discharge of current is produced at the input and/or output nodes of an integrated circuit (IC) device as a consequence of static charge build-up on the IC package. The static charge build up can result from handling of the IC device by a human body or from handling by IC device manufacturing equipments. It is known that the inadvertent presence of a sudden voltage spike in an integrated circuit can cause physical destruction of circuit features. For example, ESD-induced spikes can rupture the thin gate oxide of a field effect transistor (FET), or simply degrade the P-N junction of a semiconductor device, effectively destroying proper IC operation.

As well known in the art, lateral silicon controlled rectifier (LSCR) structures are widely used in the semiconductor integrated circuits to protect CMOS devices against high voltages during an ESD event. FIG. 1 is a schematic, cross-sectional view of a prior art LSCR structure 190. As shown in FIG. 1, LSCR structure 190 is formed in a P semiconductor layer 192 which is electrically contacted to cathode 62. An N well 194 is formed in P semiconductor layer 192. An $N^+$ region 196 is formed in P semiconductor layer 192 and is electrically contacted to cathode 62. A $P^+$ region 198 and an $N^+$ region 200 are formed in N well 194 and are electrically contacted to anode 58. A field oxide region 202 is formed in N well 194, such that field oxide region 202 is interposed between $P^+$ region 198 and $N^+$ region 200. A thin gate oxide region 203 is formed over a region of P semiconductor layer 192 which is interposed between $N^+$ region 196 and an $N^+$ region 205. $N^+$ region 205 is formed in P semiconductor layer 192 and in N well 194, such that $N^+$ region 205 overlaps a junction 206 between P semiconductor layer 192 and N well 194. A polysilicon gate layer 207 is formed over gate oxide region 203 and is electrically contacted to cathode 62. A field oxide region 204 is interposed between $P^+$ region 198 and $N^+$ region 205.

FIG. 2 is a schematic, cross-sectional view of another prior art LSCR structure 220. As shown in FIG. 2, LSCR structure 220 may be formed on a P type epitaxial semiconductor layer 222. A lightly doped N well 224 is implanted in P semiconductor layer 222. After implanting N well 224 field oxide regions 232, 234, 238 and 240 are formed. A gate oxide region 233 is grown after the formation of the field oxide regions. Subsequently, a polysilicon gate layer 237 formed on the gate oxide region 233. An $N^+$ region 226 and an $N^+$ region 230 is then formed in P semiconductor layer 222, self-aligned to field oxide region 238 and gate oxide region 233, and self-aligned to field oxide regions 232 and 240, respectively. A $P^+$ region 228 is formed in N well 224, self-aligned to field oxide regions 232 and 234.

The P semiconductor layer 222 is electrically contacted to cathode 62. $N^+$ region 226 is electrically contacted to cathode 62. $P^+$ region 228 and $N^+$ region 230 are electrically contacted to anode 58. Field oxide region 232 is interposed between $P^+$ region 228 and $N^+$ region 230. Thin gate oxide region 233 is formed over regions of P semiconductor layer 222 and of N well 224 which are interposed between $N^+$ region 226 and $P^+$ region 228, such that gate oxide region 233 is formed over a junction 236 between P semiconductor layer 222 and N well 224. Polysilicon gate layer 237 is electrically contacted to cathode 62. Field oxide region 234 is interposed between gate oxide region 233 and $P^+$ region 228. Polysilicon gate layer 237 extends over substantially all of gate oxide region 233 and over a portion of field oxide region 234.

However, the above-described LSCR structures have several shortcomings including lower efficiency and the need for larger chip area due to field oxide regions and/or $N^+$ region between the field oxide region and the thin gate oxide region in the LSCR structures. Therefore, there is a need in this industry to provide an improved silicon controlled rectifier structure for electrostatic discharge protection, which is compatible with current CMOS processes, which has low threshold trigger voltages and improved efficiency, and which occupies relatively smaller chip areas. There is also a need for a simple IC structure that provides a low ESD trigger level reliably without extensive overhead circuitry and with an efficient use of IC space.

SUMMARY OF THE INVENTION

It is one object of the invention to provide an improved silicon controlled rectifier structure for ESD protection, which is compatible with current CMOS processes, which has lower threshold trigger voltages and improved efficiency, and which occupies relatively smaller chip areas.

To these ends, according to one aspect of the present invention, there is provided a lateral silicon controlled rectifier structure, comprising a P-type substrate; an N-well region formed in the P-type substrate; a first $P^+$ doped region formed in the N-well region and being connected to an anode; a P-well region formed in the P-type substrate and bordering upon the N-well region; a first $N^+$ doped region formed in the P-well region and separated from the first $P^+$ doped region by a spacing distance, the first $N^+$ doped region being connected to a cathode; and a gate structure overlying a portion of the P-type substrate between the first $P^+$ doped region and the first $N^+$ doped region.

From one aspect of this invention, a lateral silicon controlled rectifier structure includes a P-type substrate; an N-well region formed in the P-type substrate; a first $P^+$ doped region formed in the N-well region and being connected to an anode; a P-well region formed in the P-type substrate and bordering upon the N-well region; a first $N^+$ doped region formed in the P-well region and separated from the first $P^+$ doped region by a spacing distance, the first $N^+$ doped region being connected to a cathode; a gate structure overlying a portion of the P-type substrate between the first $P^+$ doped region and the first $N^+$ doped region; a second $N^+$ doped region formed in the N-well region and separated from the first $P^+$ doped region with a first STI structure; and a second $P^+$ doped region formed in the P-well region and separated from the first $N^+$ doped region with a second STI structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

The present invention pertains to an improved silicon controlled rectifier (SCR) structure for ESD protection, which is compatible with current CMOS processes, which has lower threshold trigger voltages and improved efficiency, and which occupies relatively smaller chip areas.

Figure 1:
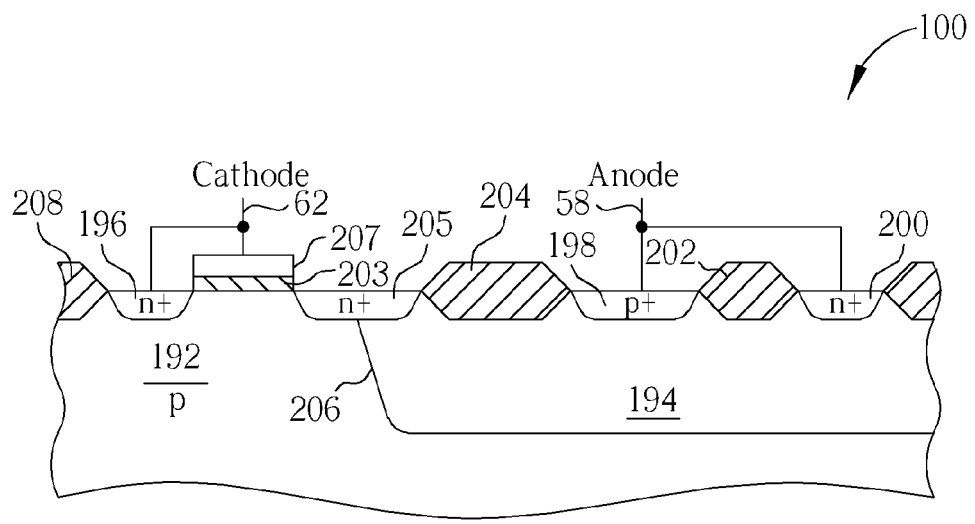
FIG. 1 is a schematic, cross-sectional view of a low-voltage triggering SCR structure according to the prior art.
Figure 2:
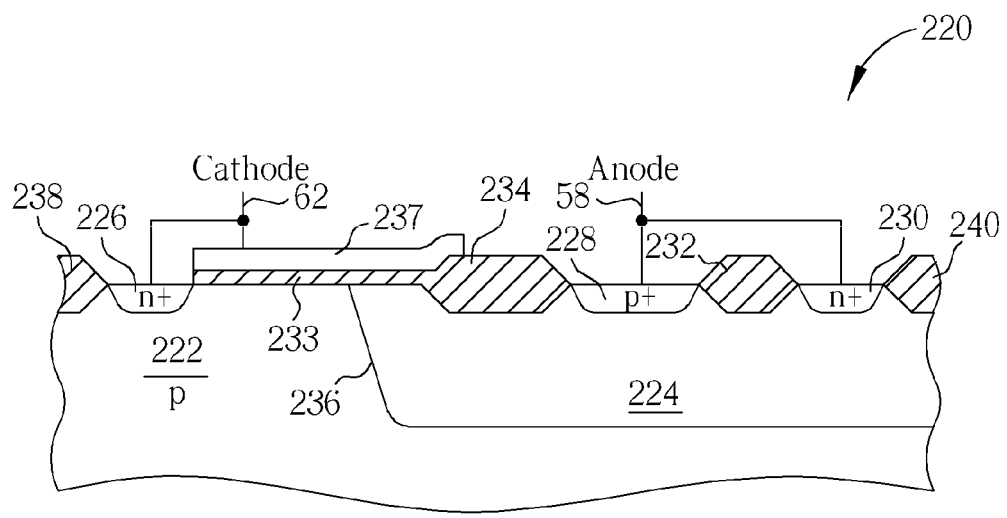
FIG. 2 is a schematic, cross-sectional view of a gate coupled LSCR structure according to the prior art.
Figure 3:
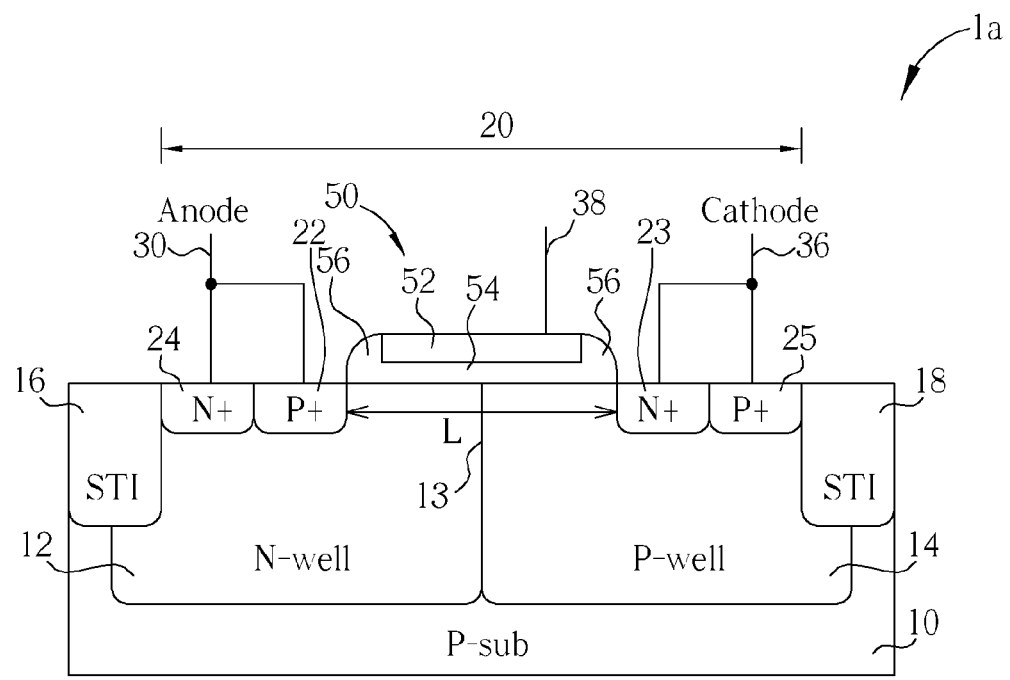
FIG. 3 is a schematic, cross-sectional view of an improved LSCR structure in accordance with one preferred embodiment of the present invention.

FIG. 3 is a schematic, cross-sectional view of an improved lateral silicon controlled rectifier (LSCR) structure 1a in accordance with one preferred embodiment of the present invention. As shown in FIG. 3, the LSCR structure 1a is fabricated within an active area 20 that is defined on a P-type semiconductor substrate 10. The active area 20 is surrounded by shallow trench isolation (STI) structures 16 and 18. The P-type semiconductor substrate 10 may be, for example, a silicon substrate, an epitaxial silicon substrate or a silicon-on-insulator (SOI) substrate. The LSCR structure 1a comprises an N-well region 12 that is formed in the P-type semiconductor substrate 10. A P-well region 14 is optionally formed in the P-type semiconductor substrate 10 and borders upon the N-well region 12. A junction 13 is formed between the N-well region 12 and the P-well region 14.

A first P+ doped region 22 is formed in the N-well region 12 and is connected to an anode 30 that may be connected to an IC pad (not shown) which may be connected to an internal circuit to be protected. A first N+ doped region 23 formed in the P-well region 14 is spaced from the first P+ doped region 22 by a spacing distance L. The first N+ doped region 23 is connected to a cathode 36 that may be a circuit ground $V_{SS}$. The first P+ doped region 22, the N-well region 12, the P-well region 14, and the first N+ doped region 23 constitute a lateral P-N-P-N silicon controlled rectifier.

A gate structure 50, which comprises a gate electrode 52 atop a gate dielectric layer 54, overlies a portion of the P-type semiconductor substrate 10 between the first P+ doped region 22 and the first N+ doped region 23. The gate structure 50 is formed over the junction 13 between the N-well region 12 and the P-well region 14. The gate structure 50 may comprises sidewall spacers 56. The first P+ doped region 22 and the first N+ doped region 23 align with the respective sidewall spacers 56. Optionally, the gate electrode 52 of the gate structure 50 may be coupled to a gate voltage 38. The gate voltage 38 may be provided by a control circuit (not shown).

A second N+ doped region 24 is formed in the N-well region 12 and is electrically coupled to the first P+ doped region 22. The second N+ doped region 24 is not limited to the position shown in FIG. 3. The second N+ doped region 24 may be disposed in other positions within the N-well region 12. A second P+ doped region 25 is formed in the P-well region 14 and is located farther from the N-well region 12 than the first N+ doped region 23. The second P+ doped region 25 is connected to the first N+ doped region 23.

According to this invention, the LSCR structure 1a can be triggered at relatively low voltages and is capable of conducting high ESD current with high efficiency once triggered, thereby effectively bypassing the ESD stress and protecting the internal circuit from ESD damage. It is one feature of this embodiment of this invention that there is no field oxide or STI structure formed within the active area 20 between the STI structures 16 and 18. Since the field oxide or STI structure is removed from its current path, the efficiency of the LSCR is significantly improved and the LSCR structure 1a therefore occupies a smaller chip area. By altering the spacing distance L, the holding voltage of the LSCR structure 1a can be adjusted.

Figure 4:
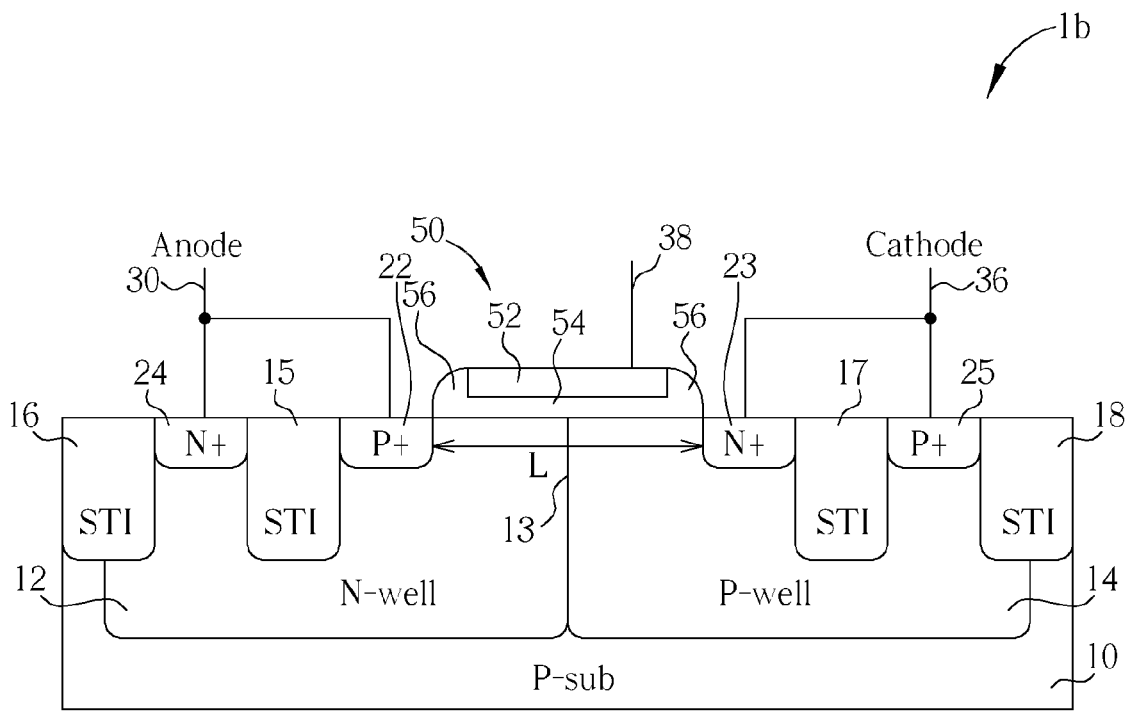
FIG. 4 is a schematic, cross-sectional view of an LSCR structure 1b in accordance with another preferred embodiment of the present invention.

FIG. 4 is a schematic, cross-sectional view of an LSCR structure 1b in accordance with another preferred embodiment of the present invention, wherein like numeral numbers designate like layers, regions or elements. As shown in FIG. 4, likewise, the LSCR structure 1b is fabricated within an active area 20 that is defined on a P-type semiconductor substrate 10. The active area 20 is surrounded by STI structures 16 and 18. The P-type semiconductor substrate 10 may be, for example, a silicon substrate, an epitaxial silicon substrate or a SOI substrate. The LSCR structure 1b comprises an N-well region 12 that is formed in the P-type semiconductor substrate 10. A P-well region 14 is formed in the P-type semiconductor substrate 10 and borders upon the N-well region 12. A P-N junction 13 is formed between the N-well region 12 and the P-well region 14.

A first P+ doped region 22 is formed in the N-well region 12 and is connected to an anode 30. A first N+ doped region 23 formed in the P-well region 14 is spaced from the first P+ doped region 22 by a spacing distance L. The first N+ doped region 23 is connected to a cathode 36 that may be a circuit ground $V_{SS}$. The first P+ doped region 22, the N-well region 12, the P-well region 14, and the first N+ doped region 23 constitute a lateral P-N-P-N silicon controlled rectifier.

A gate structure 50, which comprises a gate electrode 52 atop a gate dielectric layer 54, overlies a portion of the P-type semiconductor substrate 10 between the first P+ doped region 22 and the first N+ doped region 23. The gate structure 50 is formed over the junction 13 between the N-well region 12 and the P-well region 14. The gate structure 50 may further comprises sidewall spacers 56. The first P+ doped region 22 and the first N+ doped region 23 align with the respective sidewall spacers 56. Optionally, the gate electrode 52 of the gate structure 50 may be coupled to a gate voltage 38.

A second N+ doped region 24 is formed in the N-well region 12 and is separated from the first P+ doped region 22 with an STI structure 15 that is formed in the N-well region 12. The second N+ doped region 24 is electrically coupled to the first P+ doped region 22. A second P+ doped region 25 is formed in the P-well region 14 and is located farther from the N-well region 12 than the first N+ doped region 23. The second P+ doped region 25 is separated from the first N+ doped region 23 with an STI structure 17 that is formed in the P well region 14. The second P+ doped region 25 is electrically coupled to the first N+ doped region 23.

Those skilled in the art will readily observe that numerous modifications and alterations of the device and method may be made while retaining the teachings of the invention.

What is claimed is:

1. A lateral silicon controlled rectifier structure, comprising:
    a P-type substrate;
    an N-well region formed in the P-type substrate;
    a first P+ doped region formed in the N-well region and being directly connected to an anode;
    a P-well region formed in the P-type substrate and bordering upon the N-well region;
    a first N+ doped region formed in the P-well region and separated from the first P+ doped region by a spacing distance, the first N+ doped region being directly connected to a cathode;
    a gate structure overlying a portion of the P-type substrate between the first P+ doped region and the first N+ doped region, wherein the gate structure is right above a junction formed between the N-well region and the P-well region;
    a second N+ doped region formed in the N-well region, the second N+ doped region being directly connected to the anode and electrically coupled to the first P+ doped region; and
    a second P+ doped region formed in the P-well region, the second P+ doped region being directly connected to a cathode and electrically coupled to the first N+ doped region.

2. The lateral silicon controlled rectifier structure according to claim 1 wherein the P-type substrate comprises silicon substrate, epitaxial silicon substrate or silicon-on-insulator (SOI) substrate.

3. The lateral silicon controlled rectifier structure according to claim 1 wherein the gate structure comprises a gate electrode atop a gate dielectric layer, and the gate structure further comprises sidewall spacers.

4. The lateral silicon controlled rectifier structure according to claim 3 wherein the first $P^+$ doped region and the first $N^+$ doped region align with the sidewall spacers.

5. The lateral silicon controlled rectifier structure according to claim 3 wherein the gate electrode of the gate structure is coupled to a gate voltage.

6. The lateral silicon controlled rectifier structure according to claim 1 wherein no field oxide or shallow trench isolation (STI) structure is formed in current path of the lateral silicon controlled rectifier structure.

7. The lateral silicon controlled rectifier structure according to claim 1 wherein the second P+ doped region is located farther from the N-well region than the first N+ doped region.

8. A lateral silicon controlled rectifier structure, comprising:
    a P-type substrate;
    an N-well region formed in the P-type substrate;
    a first P+ doped region formed in the N-well region and being directly connected to an anode;
    a P-well region formed in the P-type substrate and bordering upon the N-well region;
    a first N+ doped region formed in the P-well region and separated from the first P+ doped region by a spacing distance, the first N+ doped region being directly connected to a cathode;
    a gate structure overlying a portion of the P-type substrate between the first P+ doped region and the first N+ doped region, wherein the gate structure is right above a junction formed between the N-well region and the P-well region;
    a second N+ doped region formed in the N-well region, separated from the first P+ doped region with a first electrical isolation structure, the second N+ doped region being directly connected to the anode and electrically coupled to the first P+ doped region; and
    a second P+ doped region formed in the P-well region, separated from the first N+ doped region with a second electrical isolation structure, the second P+ doped region being directly connected to a cathode and electrically coupled to the first N+ doped region.

9. The lateral silicon controlled rectifier structure according to claim 8 wherein the P-type substrate comprises silicon substrate, epitaxial silicon substrate or silicon-on-insulator (SOI) substrate.

10. The lateral silicon controlled rectifier structure according to claim 8 wherein the gate structure comprises a gate electrode atop a gate dielectric layer, and the gate structure further comprises sidewall spacers.

11. The lateral silicon controlled rectifier structure according to claim 10 wherein the first P+ doped region and the first N+ doped region align with the sidewall spacers.

12. The lateral silicon controlled rectifier structure according to claim 10 wherein the gate electrode of the gate structure is coupled to a gate voltage.

13. The lateral silicon controlled rectifier structure according to claim 8 wherein no electrical isolation structure is formed in current path of the lateral silicon controlled rectifier structure.

14. The lateral silicon controlled rectifier structure according to claim 8 wherein the second $P^+$ doped region is located farther from the N-well region than the first $N^+$ doped region.

* * * * *